United States Patent [19]
Lin

[11] Patent Number: 5,834,071
[45] Date of Patent: Nov. 10, 1998

[54] METHOD FOR FORMING A THIN FILM TRANSISTOR

[75] Inventor: Kang-Cheng Lin, Yung Ho, Taiwan

[73] Assignee: Industrial Technology Research Institute, Hsihchu Hsien, Taiwan

[21] Appl. No.: 802,344

[22] Filed: Feb. 11, 1997

[51] Int. Cl.$^6$ ............................ B05D 3/06; H01L 29/786
[52] U.S. Cl. .................. 427/578; 427/554; 427/527; 427/255.7; 438/160; 438/166; 438/488
[58] Field of Search ..................... 427/574, 578, 427/255.7, 554, 555, 527; 438/160, 161, 162, 166, 488

[56] References Cited

U.S. PATENT DOCUMENTS

| 5,241,192 | 8/1993 | Possin et al. | 257/59 |
| 5,559,344 | 9/1996 | Kawachi | 257/57 |

OTHER PUBLICATIONS

Conde et al, Mater. Res. Soc. Symp. Proc., 452, 1997, pp. 779–784.
Aoyama, Takashi, et al, "Inverse Staggered Poly–Si and Amorphous Si Double Structure TFT's for LCK Panels with Peripheral Driver Circuits Integration," *IEEE Transactions on Electron Devices*, vol. 43, No. 5, May 1996, pp. 701–705.
Asai, I., et al, "A Fabrication of Homogenious Poly–Si TFT's Using Excimer Laser Anneating," *Abstracts of the 1992 International Conference on Solid State Devices and Materials*, 1992, pp. 55–57.
Cao, Min, et al, "A High–Performance Polysilicon Thin–Film Transistor Using XeCl Excimer Laser Crystallization of Pre–Patterned Amorphous Si Films," *IEEE Transactions on Electron Devices*, vol. 43, No. 4, Apr. 1996, pp. 561–567.
De unamuno, S., et al, "A Thermal Description of the Melting of c– and a–Silicon Under Pulsed Excimer Lasers," *Applied Surface Science*, vol. 36, 1989, pp. 1–11.
Fork, D.K., et al, "Capillary Waves in Pulsed Excimer Laser Crystallized Amorphous Silicon," *Appl. Phys. Lett.*, vol. 68, Apr. 8, 1996, pp. 2138–2140.
Hayashi, H., et al, "Fabrication of Low–Temperature Bottom–Gate Poly–Si TFT's on Large–Area Substrate by Linear–Beam Excimer Laser Crystallization and Ion Doping Method," *IEDM 95*, pp. 829–832, 1995.
Kim, H.J., et al, "New Excimer–laser–crystallization Method for Producing Large–grained and Grain Boundary–location–controlled Si Films for Thin Film Transistors," *Appl. Phys. Lett.*, vol. 68, Mar. 11, 1996, pp. 1513–1515.
McCulloch, D.J., et al, "Surface Roughness Effects in Laser Crystallized Polycrystalline Silicon," *Appl. Phys. Lett.*, vol. 66, Apr. 17, 1995, pp. 2060–2062.
Wu, I–W, "Cell Design Considerations for High–Aperture–Ratio Direct–View and Projection Polysilicon TFT–LCDs," *SID 95 Digest*, pp. 19–22, 1995.

*Primary Examiner*—Roy V. King
*Attorney, Agent, or Firm*—McDermott, Will & Emery

[57] ABSTRACT

Method for forming a polycrystalline silicon (ploy-Si) film of a semiconductor device includes forming the gate electrode on a substrate and depositing a dielectric layer on the substrate and the conductive layer. Then a first layer (microcrystalline silicon:$\mu$c-Si) is formed on the dielectric layer and a second layer (hydrogenated amorphous silicon:a-Si:H) is deposited on the first layer. Noted that the polycrystalline silicon (poly-Si) can be fabricated by applying the laser annealing to the first layer and the second layer to transform them to poly-Si. Annealing the first layer and the second layer by laser, followed by fabricating the source and drain electrodes, thus the TFT with good electrical characteristics is fabricated.

27 Claims, 7 Drawing Sheets

5,834,071

METHOD FOR FORMING A THIN FILM TRANSISTOR

BACKGROUND OF THE INVENTION

1. Field of the Invention

The present invention relates to an inverted staggered low temperature ploy-Si thin-film transistor, and particularly to the laser annealed inverted staggered low temperature ploy-Si thin-film transistor.

2. Description of the Prior Art

As the density and quality of the pixels on the active matrix liquid crystal display (AMLCD) increase along the advancement of the semiconductor industry, the hydrogenated amorphous silicon (a-Si:H) thin film transistor (TFT) will be limited due to it's low mobility. High mobility polycrystalline silicon (ploy-Si) is more attractive when manufacturing TFT on the LCD (Liquid Crystal Display) and it is easier to achieve the peripheral driver circuits in integrated circuits. The above mentioned technology is described in "Cell Design Consideration for High-Aperture-Ratio Direct-View and Projection Polysilicon TFT-LCDs", 1995 Society For Information Display, Orlando, Fla. SID 1995, pp. 19–22, (1995) I-W. Wu,. The schematic cross sectional view of an inverted staggered LT (low temperature) poly-Si TFT is shown in FIG. 1.

In FIG. 1, the substrate 100 is glass and gate, source and drain electrode are 103, 101 and 102 respectively. Layer 104 is the channel of the TFT, which is poly-Si. The dielectric layer 105 is an insulating material which is hydrogenated amorphous silicon oxide (a-SiO:H). The passivation layer 106 is hydrogenated amorphous silicon nitride (a-SiN:H) deposited by plasma enhanced chemical vapor deposition (PECVD).

Hydrogenated amorphous silicon (a-Si:H) is used in the deposition of some kind of semiconductor process. Because the electrical characteristics of a-Si:H is not as good as poly-Si, the poly-Si is usually used in fabricating the thin film of thin film transistor. Hydrogenated amorphous silicon (a-Si:H) can be transformed to poly-Si by heat, and there are many ways to implement the heating process. Because the channel of TFT is very thin and the substrate of TFT is glass, the process fabricating TFT is better in low temperature. To implement the low temperature process of TFT, laser annealing is generally utilized to transform amorphous Si (a-Si) to poly-Si. The theory is mentioned in "Thermal Description of the Melting of c- and a-Silicon under Pulsed Excimer Lasers", Applied Surface Science, 36, pp, 1–11, (1989), by De Unamuon and E Fogarassy.

Amorphous silicon (a-Si) is used in the deposition of a thin-film transistor (TFT) for liquid-crystal display and is transformed to poly-Si to improve the electrical characteristics. Especially in the process of inverted staggered poly-Si thin-film transistor, the laser annealing is usually utilized to transform the a-Si on the insulating layer above gate electrode to poly-Si to act as a channel of TFT. The annealing laser used to crystalize polysilicon is described in "New Excimer-Laser-Crystallization Method for Producung Large-grained and Grain Boundary-Location-Controlled Si Films for Thin Film Transistors", Appl. Phys. Lett., 68, pp. 1513–1515 (1996), H. J. Kim and James S. Im,.

To implement the poly-Si on the insulating layer above gate electrode, the power of annealing laser must be controlled carefully. Because the electrical characteristics of TFT is mainly determined by the poly-Si on the insulating layer above gate electrode, annealing process is a determinant process that effects the electrical characteristics of the TFT. If the power of annealing laser is too small, the a-Si deposited on the insulating layer above gate electrode can not be transformed to poly-Si completely, and it is the reason why the electrical characteristics of the TFT is poor.

To prevent the previous mentioned condition, the power of the annealing laser must be enhanced to transform the a-Si to poly-Si. When the power of annealing laser is too large, some parts of the a-Si on the insulating layer above gate electrode or even parts of TFT itself can be evaporated, and this can result in the roughness of surface as well as the unexpected characteristics. The effect is described in "Surface Roughness Effects in Laser Crystallized Polycrystalline Silcon", Appl. Phys. Lett., 66, pp. 2060–2062, (1995), by D. J. Mcculloch and S. D. Brotherton. In addition, the insulating layer above gate electrode may be damaged due to the exceeding heat transferred via a-Si or poly-Si, and this can result in some defects in the insulating layer of a TFT and makes leakage current arise. The gate metal may diffuse into the insulating layer because of the exceeding heat, and even more make the source and drain electrode short circuited. Because the power of annealing laser can not too large or too small, the control of the power of annealing laser is a critical process in the fabrication of TFT.

Another problem is that when the thickness of the layer of the deposited a-Si is large, the deep part of a-Si can not be transformed to poly-Si in a laser annealing step.

Because the process of fabricating an inverted staggered poly-Si thin-film transistor preferes the low-temperature process, laser annealing is most frequently used in the process of an inverted staggered poly-Si thin-film transistor. The processes mentioned above is listed in "Fabrication of Low-Temperature Bottom Gate Poly-Si TFTs on Large-Area Substrate by linear-Beam Excimer Laser Crystallization and Ion Doping Method", 1995 International Electron Devices meeting, Washington, D.C., IEDM 95, pp. 829–832, (1995), by H. Hayashi. According to the reason mentioned in the above section, it is difficult to control the power of annealing laser, and the process to form a layer of poly-Si on the insulating layer above gate electrode is very complicated.

The construction of the interface between poly-Si regions and gate insulator in low laser annealing power is shown in FIG. 2. It is clear that there are portions of a-Si 203 remained in the channel 202 at the surface contacting gate insulating layer 201. When the carrier passby, the carrier will be scattered by a-Si 203. If the a-Si is replaced by $\mu$c-Si or poly-Si, the condition of scattering would be reduced, which results in the improvement of electrical characteristics of TFT.

SUMMARY OF THE INVENTION

Method for forming a polycrystalline silicon (ploy-Si) film of an inverted staggered poly-Si thin-film transistor is composed of the following steps of forming the gate electrode on a substrate and depositing a dielectric layer on the substrate and the conductive layer. Then a microcrystalline silicon ($\mu$c-Si) layer of 3 nm in thickness is deposited on the dielectric layer and a amorphous silicon (a-Si) layer of 60 nm in thickness is deposited is on the first layer. Note that the polycrystalline silicon (poly-Si) can be fabricated by applying the laser annealing to the $\mu$c-Si layer and the a-Si layer to transform them to poly-Si. The process is detailed in "A Fabrication of Homogenious Poly-Si TFTs Using Excimer Laser Annealing", Extented Abstracts of the 1992 International Conference on Solid State Devices and Materials, Tsukuba, pp. 55–57, (1992), by Asia, N. Kato, et.

al. Annealing the μc-Si layer and the a-Si layer followed by fabricating the source and drain electrodes, thus the inverted staggered poly-Si thin-film transistor with good electrical characteristics is fabricated. The structure is described in "Inverse Staggered Poly-Si and Amorphuous Si Double Structure TFTs for LCD panels with Peripheral Driver Circuit Integration", IEEE Trans on ED. Vol. 43, no. 5, pp 701–705, (1996), by Takashi Aoyama, et. al.

The present invention offers a method to overcome the disadvantage of the above mentioned technique by adding a thin layer of PECVD μc-Si (microcrystalline Si) between the film of a-Si and gate insulator as a buffer layer; to enlarge the process energy range of excimer laser and to suppress the serious problem of carrier trapping and scattering by the a-Si or the grain boundaries and defects of small poly-Si regions at the interface between poly-Si regions and gate insulator. Thus the performance of characteristics of the bottom gate LT (low temperature) poly-Si TFT will be improved. The performance of the thin-film transistor is shown in "A High Performance Polysilicon Thin-Film transistor Using XeCI Excimer Laser Crystallization of Pre-Patterned Amorphuous Si Films", IEEE Trans. on E.D., vol 43, no. 4, pp. 561–567, (1996), by Min Cao, et. al.

In the process of fabricating an inverted staggered low temperature poly-Si thin-film transistor, the present invention offered a very convenient method to perform laser annealing with the electrical characteristics better than that of the prior art, and the temperature of all the processes is controlled below 400° C.

BRIEF DESCRIPTION OF THE DRAWINGS

The above features of the present invention will be more clearly understood from consideration of the following descriptions in connection with accompanying drawings in which:

FIG. 3A is the cross-sectional view of an inverted staggered poly-Si thin-film transistor illustrating the steps of forming a gate electrode, an dielectric layer, the microcrystalline silicon (μc-Si) layer and the hydrogenated amorphous silicon (a-Si:H) layer on a substrate according to one embodiment of the present invention.

FIG. 3B is the cross-sectional view of an inverted staggered poly-Si thin-film transistor illustrating the steps of forming a patterned photoresist by the backside exposure.

FIG. 3C is the cross-sectional view of an inverted staggered poly-Si thin-film transistor illustrating the steps of forming heavily doped region in the μc-Si layer and the a-Si layer by phosphorus ion implant.

FIG. 3D is the cross-sectional view of an inverted staggered poly-Si thin-film transistor illustrating the steps of removing the patterned photoresist and annealing the μc-Si layer and the a-Si layer by laser annealing.

FIG. 3E is the cross-sectional view of an inverted staggered poly-Si thin-film transistor illustrating the steps of patterning photoresist used to form the channel on a poly-Si layer formed by laser annealing.

FIG. 3F is the cross-sectional view of an inverted staggered poly-Si thin-film transistor illustrating the steps of forming the channel and source/drain region of the TFT, forming the source/drain electrode of the TFT and the passivation layer of the TFT.

DESCRIPTION OF THE PREFERRED EMBODIMENT

Since more and more products of low temperature (LT) polycrystalline (poly-Si) TFT liquid crystal display had been pronounced, using lower and lower temperature of process with excimer laser to fabricate LT poly-Si TFT as the switch of pixel and the peripheral driver circuits is current main stream. Therefore to deposit different films using plasma enhanced chemical vapor deposition (PECVD) is a permissible method and all process temperature can be controlled under the temperature of 400° C. Basically, for bottom gate inverted staggered poly-Si thin film transistor, it is very difficult to adjust a proper energy of excimer laser for transforming a-Si to poly-Si and getting a good property of electron transporting between poly-Si over gate insulator.

In the process of fabricating bottom gate inverted staggered poly-Si thin film transistor, the present invention offers a method to form a film of poly-Si in low temperature by laser annealing in one process without a-Si remained in the thin film or damage of transistor itself. Because the film of poly-Si is formed in one process of annealing, the electrical characteristics is better than that of two-step annealing.

Figure 3A:
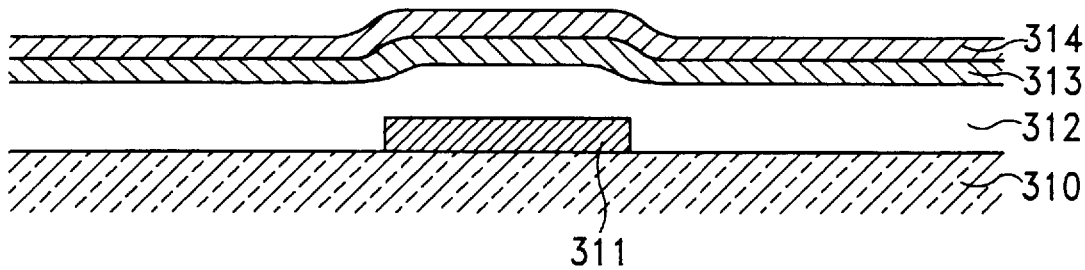
FIG. 3A~FIG. 3F show the sequence of processes how the inverted staggered poly-Si thin-film transistor of the first preferred embodiment is fabricated.

Referring to FIG. 3A, metal Chromium (Cr) is sputtered above glass substrate 310 to form Cr layer 311 which acts as a gate electrode in the TFT. The thickness of Cr layer 311 is 200 nm and the dimension of glass substrate 310 is 300×300 mm$^2$. The following step is to deposit a film of hydrogenated amorphuous silicon oxide (a-SiO:H) by plasma enhanced chemical vapor deposition (PECVD) in and on the glass substrate 310 as a-SiO:H layer 312 of 300 nm in thickness. Microcrystalline silicon (μc-Si) is deposited on a-SiO:H layer 312 by PECVD as μc-Si layer 313 of thickness 3 nm. The dielectric layer is used to act as an insulating layer between gate electrode and the channel.

To form the μc-Si, the gas mixture used in PECVD is $H_2$ and $SiH_4$ and the flow rate ratio of $H_2$ to gas mixture must larger than 90%. In this process of PECVD forming μc-Si, the flow rate of $H_2$ is 195 sccm and the flow rate of $SiH_4$ is 5 sccm. Hydrogenated amorphous silicon (a-Si:H) is deposited on μc-Si layer 313 by PECVD as a-Si:H layer 314 of thickness 60 nm. The flow rate of $SiH_4$ used in this process is 40 sccm. The temperature of both PECVD processes is about 260° C.

Figure 3B:
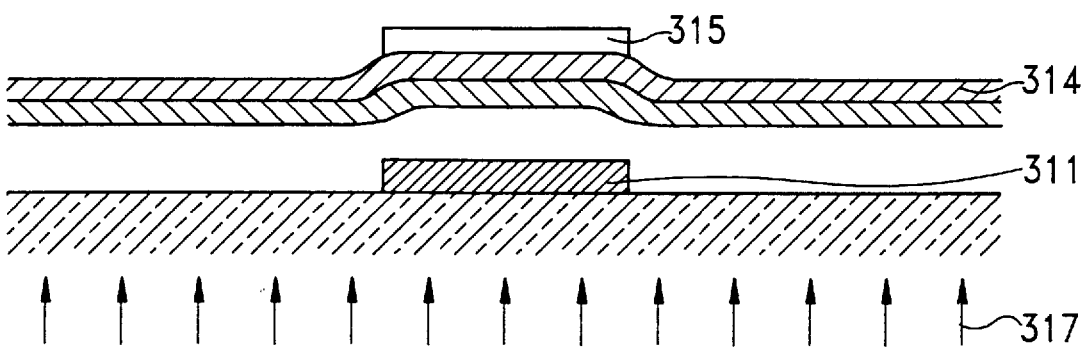

Referring to FIG. 3B, the next step is to coat photoresist (PR) on a-Si:H layer 314 followed by the backside exposure to make the PR shaded by Cr layer 311 patterned without additional photomask, because the gate electrode (Cr layer 311) itself acts as a photomask in the backside exposure process. The schematic cross-section view of the wafer showing backside exposure is presented in FIG. 3B and the source of light is shown by 317.

Figure 3C:
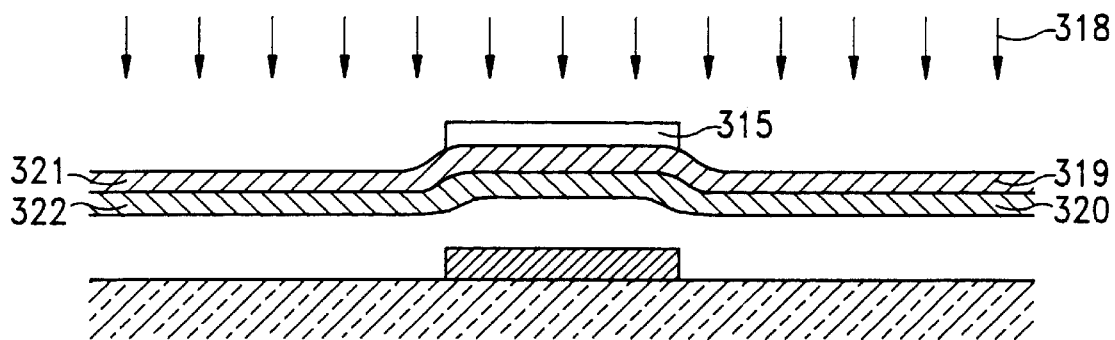

Referring to FIG. 3C, after the patterned PR 315 is acquired, the heavily doped regions used to contact with the source electrode and the drain electrode is formed by the plasma treatment which is phosphorus ion implant shown by 318. The phosphorus ion implant is performed by the plasma of the mixture of gases with 1% $PH_3$ in $H_2$ at room temperature. Thus the exposed part of a-Si:H layer 314 and underlying µc-Si layer 313 is turned to heavily doped regions shown as heavily doped a-Si:H layer 319, 321 and heavily doped µc-Si layer 320, 322.

Figure 3D:
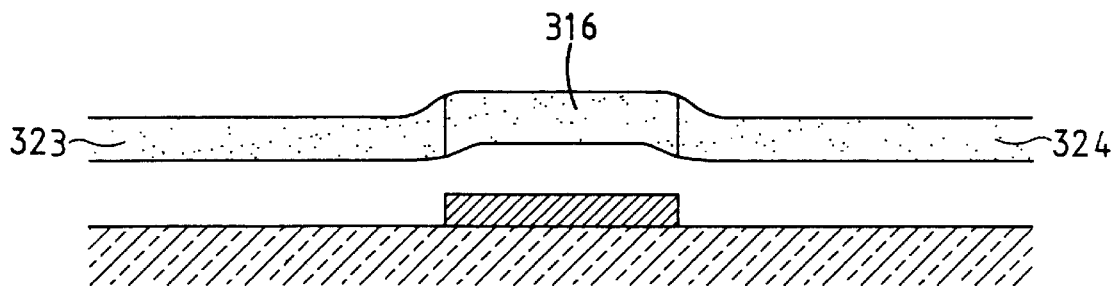

After removing the photoresist the laser annealing is applied to the wafer, refer to FIG. 3D, the substrate is annealed at a temperature of 400° C. for 2 hours under the $N_2$ flowing environment to reduce the H content embedded in a-Si:H. The process mentioned above is not necessary because the a-Si:H film can be irradiated with lower laser energy, and similar result can be obtained. Laser annealing is applied to anneal the a-Si:H layer 313 and transform it to poly-Si shown as the poly-Si layer 316, the heavily doped regions: 319, 320 and 321, 322 is transformed to heavily doped poly-Si regions 323 and 324 respectively. It is appreciated that a conventional thermal annealing process could be used instead for this structure. After the laser annealing process, the whole a-Si:H layer is transformed to poly-Si which is shown in FIG. 3D.

Figure 3E:
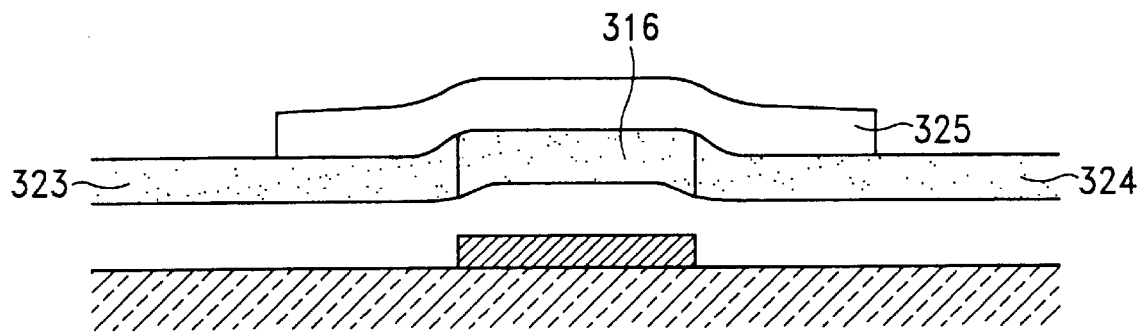
Figure 3F:
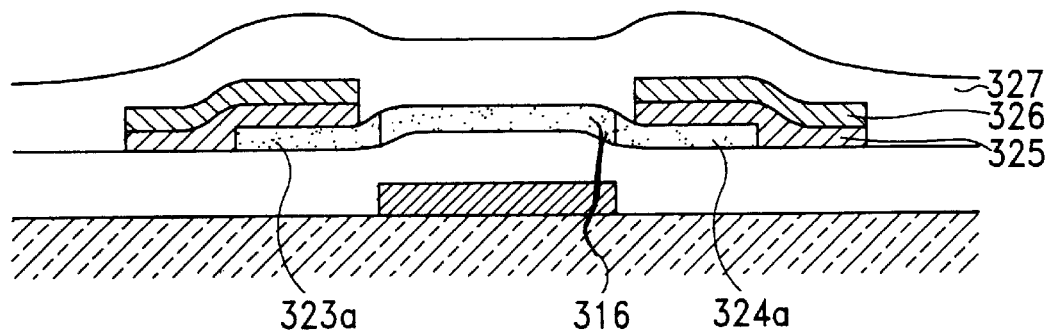

In FIG. 3E, photoresist 325 is patterned and followed by the step of etching of heavily doped poly-Si. The remained poly-Si is shown in FIG. 3F as 323a, 324a and 316. The following step is to sputter the contact metal of source and drain, which is performed by consecutively sputtering a 50 nm Cr and a 600 nm Al film shown as Cr layer 325 and Al layer 326 in FIG. 3F respectively. Then the substrate is treated by $H_2$ plasma for 1 hour followed by a 400 nm a-$SiN_x$:H deposited by PECVD at a temperature of 260° C. which is shown as passivation layer 327.

Figure 4:
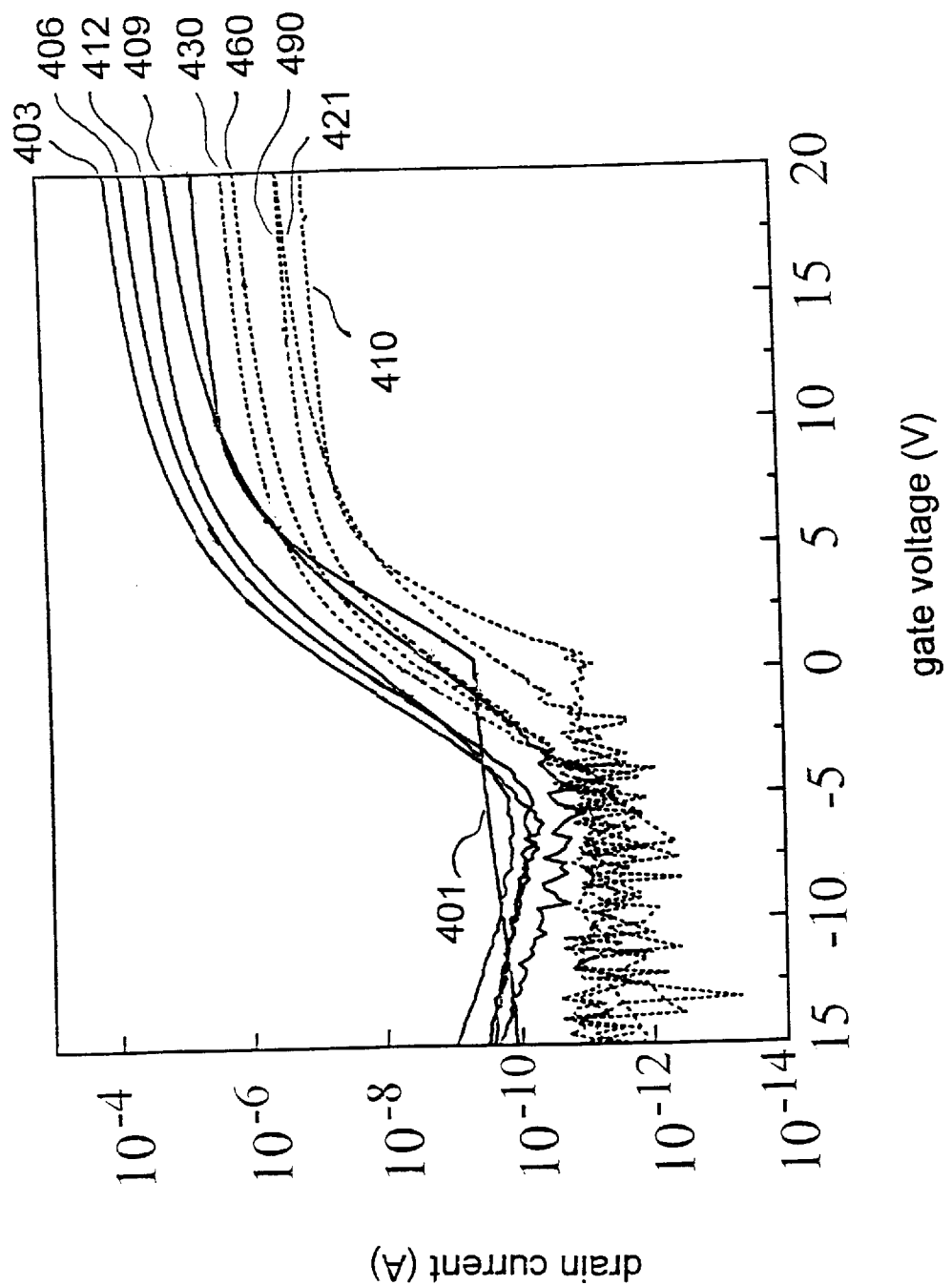
FIG. 4 is the transfer curves of $I_{DS}$ VS. $V_{GS}$ of the TFT fabricated by the first preferred embodiment with different thickness of μc-Si layer annealed by excimer laser with energy density of 254 mJ/cm$^2$.

The thickness of µc-Si layer 313 is chosen as 3 nm, because the experiment of poly-Si TFT with different thickness of µc-Si layers is took place and the electrical characteristics is shown in FIG. 4 by transfer curves of $I_{DS}$ VS. $V_{GS}$. The dashed line stands for the condition that $V_{DS}$ equals to 0.1 volt and the other type of line stands for the condition that $V_{DS}$ equals to 5 volt. In this experiment, the poly-Si layer is fabricated by the excimer laser of energy density 254 mJ/$cm^2$.

Referring to FIG. 4, the line 401 and 410 represent the condition that the µc-Si layers is 0 nm in thickness. The line 403 and 430 represent the condition that the µc-Si layers is 3 nm in thickness. The line 406 and 460 represent the condition that the µc-Si layers is 6 nm in thickness. The line 409 and 490 represent the condition that the µc-Si layers is 9 nm in thickness. The line 412 and 421 represent the condition that the µc-Si layers is 12 nm in thickness. It is clear that line 403 and 430 stand for the best condition whereas line 401 and 410 stand for the worst one. Besides, the horizontal coordinate and vertical coordinate represent the current between drain and source and the voltage between gate and source respectively. The unit of the current between drain and source is ampere(A) and the unit of voltage between gate and source is voltage(V).

Figure 5:
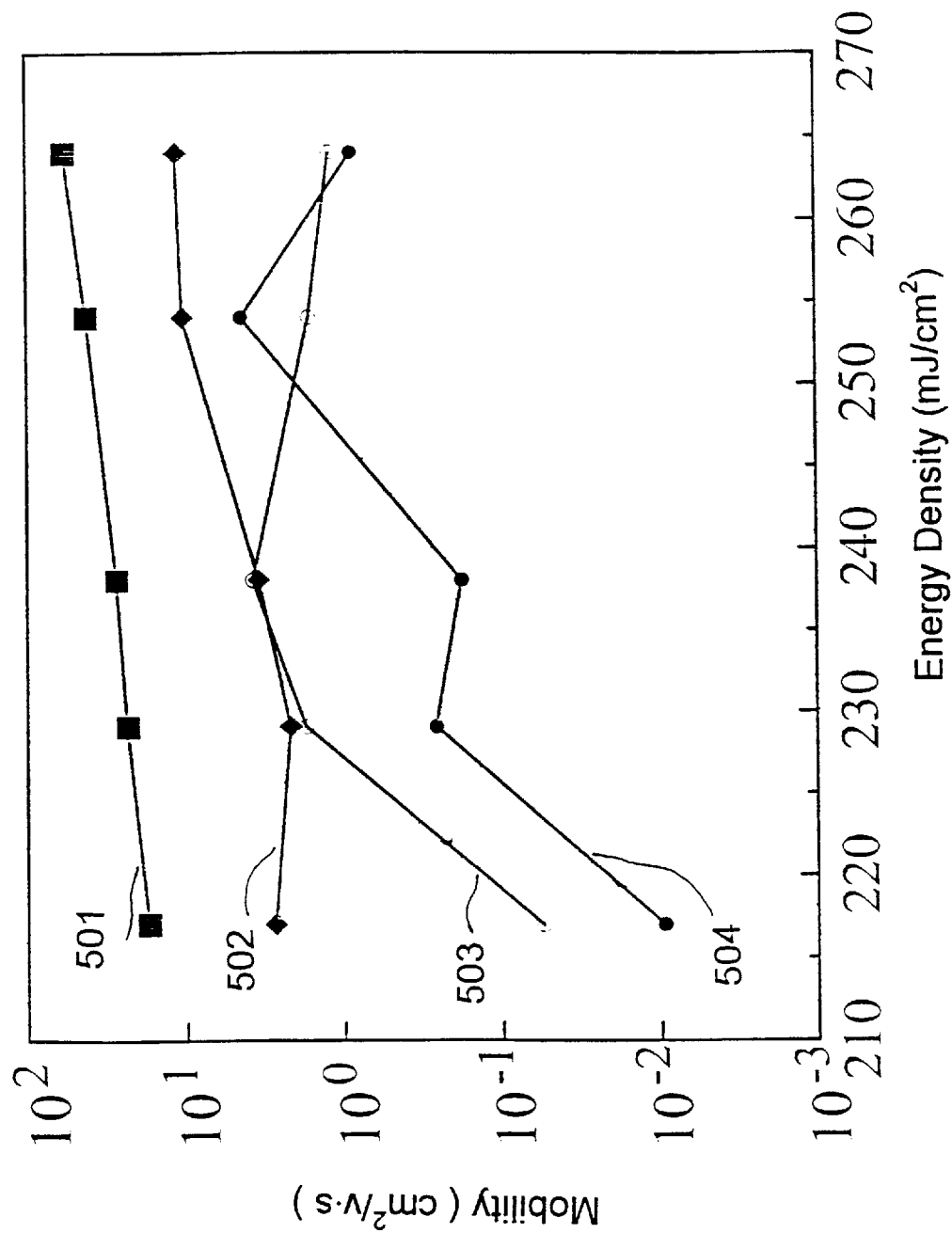
FIG. 5 shows the plot of mobility vs. energy density of XeCI excimer laser with different thickness of the μc-Si layer of the TFT fabricated by the first preferred embodiment.

The power of annealing laser is adjustable, so the other experiment is performed by XeCl laser with several different levels of energy density and different thickness of µc-Si layers. The energy density utilized in this experiment is 217,229,238, and 264 mJ/$cm^2$ respectively, and each marked data of mobility is averaged by that of 9 identical devices. FIG. 5 shows the mobility with respect to those poly-Si TFTs of various thickness of µc-Si layers such as 3 nm, 6 nm, 9 nm and 12 nm, which are annealed by different energy density of laser. Referring to FIG. 5, line 501, 502, 503 and 504 represents the conditions that the thickness of µc-Si is 3, 6, 9 and 12 nm respectively. No matter how the energy of annealing laser is changed, it is very clear that the TFT with only 3 nm µc-Si has the best performance among all the TFTs of different thickness of µc-Si. The mobility of some devices annealed by excimer laser with energy density of 264 mJ/$cm^2$. Besides, the horizontal coordinate and vertical coordinate represent the energy density of XeCl excimer laser and the field effect mobility respectively. The unit of the energy density of XeCl excimer laser is mJ/$cm^2$ and the unit of the field effect mobility is $cm^2$/v·s.

Figure 1:
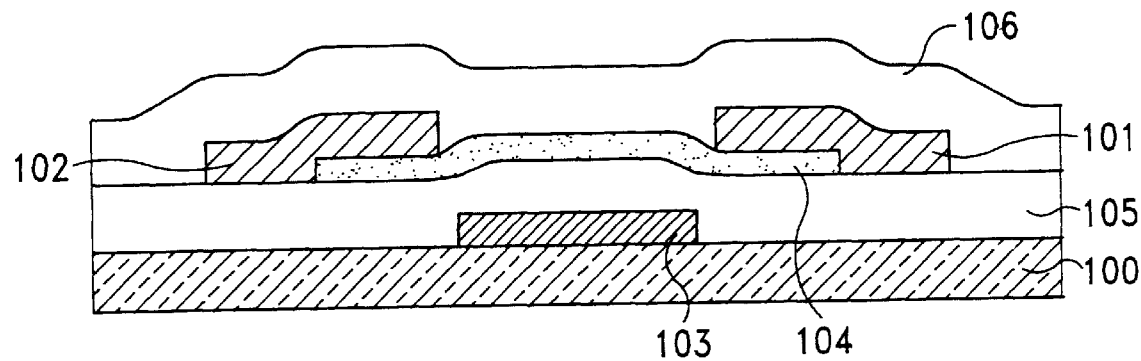
FIG. 1 is a cross-sectional view of a conventional inverted staggered poly-Si thin-film transistor.
Figure 2:
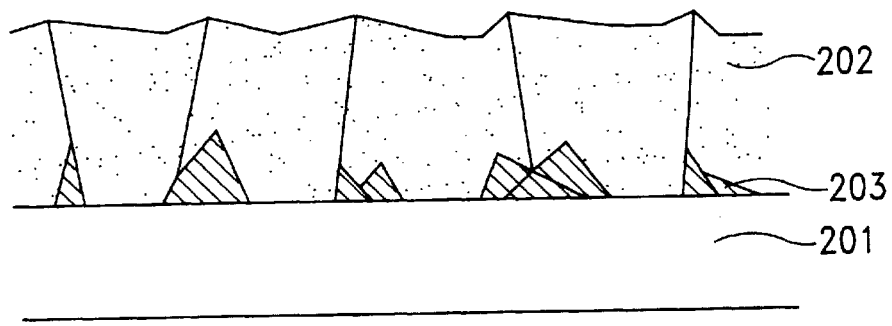
FIG. 2 is the cross section of the channel in a conventional inverted staggered poly-Si thin-film transistor with the a-Si crystal remained at the interface of the insulating layer and the poly-Si layer, which shown in the crystal point of view.
Figure 6:
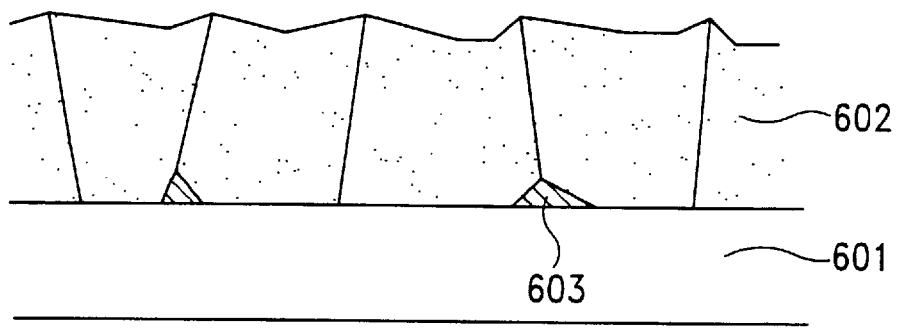
FIG. 6 is the cross section of the channel in an low temperature inverted staggered poly-Si thin-film transistor with the a-Si crystal replaced by the μc-Si at the interface of the insulating layer and the poly-Si layer, which shown in the crystal point of view.

Been processed by previously mentioned steps, the sectional view of the channel layer is shown in FIG. 6. In which the poly-Si is 602 and insulating layer 601 almost the same with FIG. 2, and a-Si is replaced by µc-Si shown in FIG. 6 as 603. It is why the present invention can offer a TFT with better electrical characteristics.

Although specific embodiments have been illustrated and described, it will be obvious to those skilled in the art that various modification may be made without departing from the spirit which is intended to be limited solely by the appended claims.

What is claimed is:

1. Method for forming a polycrystalline silicon (ploy-Si) film of a semiconductor device, said method comprising:

forming a conductive layer on a substrate;

forming a dielectric layer on said substrate and said conductive layer;

forming a first layer on said dielectric layer;

forming a second layer on said first layer;

patterning a photoresist layer on said second layer;

defining a plurality of doped regions in said first layer and said second layer;

annealing said first layer and said second layer by a laser, thereby said first layer and said second layer are transformed to a polycrystalline silicon (poly-Si) layer;

patterning a channel region by etching portions of said poly-Si layer;

defining source and drain region in said poly-Si layer;

forming a source electrode and a drain electrode of said semiconductor device; and forming a passivation layer on said source electrode, said drain electrode, said channel region and said dielectric layer.

2. The method as claim 1, wherein said conductive layer comprises metal.

3. The method as claim 2, wherein said metal is chromium (Cr).

4. The method as claim 1, wherein said dielectric layer comprises a-$SiO_x$:H (hydrogenated amorphous silicon oxide).

5. The method as claim 4, wherein said dielectric layer is formed by plasma enhanced chemical vapor deposition (PECVD).

6. The method as claim 1, wherein said first layer comprises microcrystalline silicon (µc-Si).

7. The method as claim 6, wherein said first layer is formed by PECVD.

8. The method as claim 6, wherein said first layer is of the thickness about 3~12 nm.

9. The method as claim 1, wherein said second layer comprises hydrogenated amorphuous silicon (a-Si:H).

10. The method as claim 9, wherein said second layer is formed by PECVD.

11. The method as claim 1, wherein said photoresist layer is patterned by the use of backside exposure when said substrate is a transparent glass.

12. The method as claim 1, wherein said plurality of doped regions are formed by ion implanting.

13. The method as claim 1, wherein said first layer and said second layer are annealed by an excimer laser.

14. The method as claim 13, wherein said laser annealing is performed by XeCl excimer laser of the power from about 217 to 264 mJ/cm$^2$.

15. The method as claim 1, wherein said source electrode and said drain electrode comprise metal.

16. Method for forming a polycrystalline silicon (ploy-Si) film of a semiconductor device, said method comprising:

forming a conductive layer on a substrate said conductive layer comprising metal;

forming a dielectric layer on said substrate and said conductive layer;

forming a first layer on said dielectric layer, wherein said first layer comprises microcrystalline silicon ($\mu$c-Si);

forming a second layer on said first layer, wherein said second layer comprises hydrogenated amorphous silicon (a-Si:H);

patterning a photoresist layer on said second layer;

defining a plurality of doped regions in said first layer and said second layer;

annealing said first layer and said second layer by a laser, thereby said first layer and said second layer are transformed to a polycrystalline silicon (poly-Si) layer;

patterning a channel region by etching portions of said poly-Si layer;

defining source and drain region in said poly-Si layer;

forming a source electrode and a drain electrode of said semiconductor device; and forming a passivation layer on said source electrode, said drain electrode, said channel region and said dielectric layer.

17. The method as claim 16, wherein said dielectric layer comprises a-SiO$_x$:H.

18. The method as claim 17, wherein said a-SiO$_x$:H is deposited by plasma enhanced chemical vapor deposition (PECVD).

19. The method as claim 16, wherein said microcrystalline silicon ($\mu$c-Si) is formed by PECVD at the temperature from about 260°~400° C.

20. The method as claim 16, wherein said second layer comprises hydrogenated amorphous silicon (a-Si:H) is formed by PECVD at the temperature from about 260°~400° C.

21. The method as clam 19, wherein said $\mu$c-Si is of the thickness from about 3~12 nm.

22. The method as claim 20, wherein said a-Si:H is of the thickness about 60 nm.

23. The method as claim 16, wherein said photoresist layer is patterned by the use of backside exposure when said substrate is a transparent glass.

24. The method as claim 16, wherein said plurality of doped regions are formed by ion implanting.

25. The method as claim 16, wherein said first layer and said second layer are annealed by an excimer laser.

26. The method as claim 25, wherein said laser annealing is performed by XeCl excimer laser of the power from about 217 to 264 mJ/cm$^2$.

27. The method as claim 16, wherein said source electrode and said drain electrode comprise metal.

* * * * *

UNITED STATES PATENT AND TRADEMARK OFFICE
CERTIFICATE OF CORRECTION

PATENT NO. : 5,834,071
DATED : November 10, 1998
INVENTOR(S) : Kang-Cheng Lin

It is certified that error appears in the above-indentified patent and that said Letters Patent is hereby corrected as shown below:

On the cover sheet, under Assignee, change "Hsihchu" to --Hsinchu--

Signed and Sealed this

Twenty-third Day of March, 1999

Attest:

Q. TODD DICKINSON

*Attesting Officer*  *Acting Commissioner of Patents and Trademarks*